United States Patent
Mandel-Senft et al.

(10) Patent No.: US 11,543,822 B2
(45) Date of Patent: Jan. 3, 2023

(54) AUTOMATED INSPECTION OF AUTONOMOUS VEHICLE EQUIPMENT

(71) Applicant: GM Cruise Holdings LLC, San Francisco, CA (US)

(72) Inventors: Adam Mandel-Senft, Phoenix, AZ (US); Tracy Cheung, San Francisco, CA (US); Michael Frank Schmidt, Scottsdale, AZ (US)

(73) Assignee: GM Cruise Holdings LLC, San Francisco, CA (US)

( * ) Notice: Subject to any disclaimer, the term of this patent is extended or adjusted under 35 U.S.C. 154(b) by 384 days.

(21) Appl. No.: 16/850,308

(22) Filed: Apr. 16, 2020

(65) Prior Publication Data
US 2021/0325888 A1   Oct. 21, 2021

(51) Int. Cl.
| | |
|---|---|
| *G05D 1/02* | (2020.01) |
| *B60K 35/00* | (2006.01) |
| *G06N 20/00* | (2019.01) |
| *G05B 19/41* | (2006.01) |
| *G05B 19/4155* | (2006.01) |
| *B60L 53/16* | (2019.01) |
| *G01J 5/00* | (2022.01) |
| *G01R 31/66* | (2020.01) |
| *G01S 17/89* | (2020.01) |

(52) U.S. Cl.
CPC .......... *G05D 1/0212* (2013.01); *B60K 35/00* (2013.01); *B60L 53/16* (2019.02); *G01J 5/00* (2013.01); *G01R 31/66* (2020.01); *G01S 17/89* (2013.01); *G05B 19/4155* (2013.01); *G05D 1/0238* (2013.01); *G05D 1/0246* (2013.01); *G05D 1/0276* (2013.01); *G06N 20/00* (2019.01); *G01J 2005/0077* (2013.01); *G05B 2219/50393* (2013.01); *G05D 2201/0213* (2013.01)

(58) Field of Classification Search
CPC .. G05D 1/0212; G05D 1/0238; G05D 1/0246; G05D 1/0276; G05D 2201/0213; B60K 35/00; B60K 2370/171; B60K 2370/95; B60K 37/04; B60K 2370/152; B60K 2370/167; B60K 2370/175; B60K 2370/21; B60K 2370/48; B60K 2370/589; B60L 53/16; B60L 53/30; B60L 53/36; B60L 2260/32; B60L 2260/46; G01J 5/00; G01J 2005/0077; G01R 31/66; G01R 31/007; G01S 17/89; G01S 17/42; G05B 19/4155; G05B 2219/50393; G06N 20/00; Y02T 10/70; Y02T 10/7072; Y02T 90/14; Y02T 90/16
See application file for complete search history.

(56) References Cited

U.S. PATENT DOCUMENTS

2005/0143956 A1* 6/2005 Long .................. F04D 15/0088
702/184
2015/0348335 A1* 12/2015 Ramanujam ........... G06Q 10/00
701/23

* cited by examiner

*Primary Examiner* — Rodney A Butler
(74) *Attorney, Agent, or Firm* — Akona IP PC (57) ABSTRACT

An equipment inspection system receives data captured by a sensor of an autonomous vehicle (AV). The captured data describes a current state of equipment for servicing the AV. The equipment inspection system compares the captured data to a model describing an expected state of the equipment. The equipment inspection system determines, based on the comparison, that the equipment differs from the expected state. The equipment inspection system may transmit data describing the current state of the equipment to an equipment manager. The equipment manager may schedule maintenance for the equipment based on the current state of the equipment.

20 Claims, 3 Drawing Sheets

AUTOMATED INSPECTION OF AUTONOMOUS VEHICLE EQUIPMENT

TECHNICAL FIELD OF THE DISCLOSURE

The present disclosure relates generally to autonomous vehicles (AVs) and, more specifically, to devices and methods for using AVs to perform inspections of equipment used by AVs.

BACKGROUND

In conventional automobile contexts, drivers use equipment to service their automobiles. For example, drivers use gasoline pumps to fuel gas-powered vehicles, and drivers plug electric vehicles into chargers at their homes or at businesses. Drivers and other people who manage such equipment, such as gas station employees, can observe when equipment is not functioning properly or is reaching the end of its life. Current fleet management systems for driverless AVs similarly rely on manual processes to use and inspect various equipment for servicing the AV fleet. For example, a fleet operator working at an AV maintenance facility plugs electric vehicles into charging stations. The fleet operator can identify any faults or wear in the charging stations during use of the equipment. Other fleet operators may also periodically use and inspect car washes, other cleaning equipment, and maintenance equipment.

AV servicing and maintenance tasks are increasingly being automated, so that human operators are no longer involved in certain routine servicing and maintenance tasks. As more tasks become automated, fewer human operators will be present in AV facilities and able to observe faults in the equipment during their routine use of the equipment. However, the equipment still needs to be maintained and monitored. Sensors can be built into equipment, but this requires building additional hardware and capabilities for each type of equipment. Furthermore, equipment sensors cannot detect all potential issues or failure points.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

Fleet operators of conventional or autonomous vehicles rely on routine manual inspection of equipment for servicing the vehicles to verify proper operation of the equipment. For example, a fleet operator working on-site within an AV facility plugs electric AVs that arrive at the facility for charging into charging stations located within the facility. The fleet operator may also manually inspect other equipment used to service the vehicles, such as car washes, vacuums, maintenance equipment (e.g., automotive lifts), or other equipment in the AV facility. Some equipment may include sensors for detecting faults, e.g., a charging station may have a sensor indicating when the charging station is not receiving power or is not properly outputting power. However, existing sensors may not detect every mode of failure, such as when the plug has broken, or when electronic parts have been damaged due to overheating. Furthermore, the sensors may not detect conditions indicating that equipment is wearing out and soon needs servicing, such as when the plug is becoming misshapen.

As AV maintenance tasks are increasingly automated, manual inspection of AV maintenance equipment becomes less efficient. As fewer human operators are needed on-site to operate the equipment on a routine basis, equipment goes longer without manual inspection, which increases the likelihood that equipment becomes in operable for a lengthy period of time. For example, without human operators regularly using and assessing equipment, wear patterns that can be detected by a human operator and scheduled for repair may go unnoticed until the equipment fails. Furthermore, without a human operator on-site to examine equipment, it can take a service technician multiple trips to fix the broken equipment, e.g., a first trip to assess the equipment, and a second trip to fix the equipment after gathering the needed parts and tools.

The equipment inspection system described herein uses AVs to perform automatic inspection of equipment used for servicing AVs, such as charging stations, car wash facilities, cleaning equipment, and maintenance equipment. An AV includes one or more sensors for capturing data describing the current state of a piece of equipment. For example, the AV may include cameras, radar sensors, lidar sensors, thermal sensors, and/or microphones. An equipment analyzer implemented by the AV or a fleet management system receives the captured sensor data and compares the captured sensor data to an expected state of the equipment to determine if the equipment differs from the expectation. As used herein, an expected state is a state in which the equipment is properly functioning, e.g., a state in which the equipment is not damaged, broken, or excessively worn out. The equipment analyzer may also or alternatively compare the captured sensor to sensor data describing the equipment in one or more known failure modes or wear patterns to identify a failure mode or wear level of the equipment. A fleet management system can schedule maintenance or replacement of the equipment based on output from the equipment analyzer. For example, if the equipment analyzer indicates that a charging station has a broken plug, the fleet management system instructs an operator to replace the plug, and in the meantime, instructs the AV, and other AVs in the fleet, to use other charging stations.

Using an AV fleet to inspect equipment enables the fleet management system to perform frequent and thorough inspection of equipment for servicing AVs. For example, each time an AV in the fleet arrives at a charging station for charging, the AV can perform an automated inspection of the charging station. AVs typically have multiple different sensors that can be used to analyze various aspects of equipment in detail. For example, an AV can collect visual images with cameras, point clouds that describe the shape of equipment or parts with a lidar sensor and/or radar sensor, thermal images that show whether equipment is overheating or not operational with a thermal sensor, and audio files of any noises that the equipment is making with a microphone. In addition, the AV can autonomously maneuver itself to different positions to capture data from different angles relative to the equipment. The fleet management system uses the gathered data to diagnose any equipment failures and automatically schedule maintenance or replacement of equipment or parts. Furthermore, the information gathered by the AV allows repair technicians to work efficiently, reducing the amount of on-site diagnostics required of the technicians, and allowing technicians to gather the parts and tools they need to service the equipment without first physically inspecting the equipment.

Embodiments of the present disclosure provide a system for inspecting equipment by an autonomous vehicle (AV). The system includes a sensor interface, an equipment analyzer, and a communications interface. The sensor interface is configured to receive data captured by at least one sensor, the captured data describing a current state of equipment for servicing the AV. The equipment analyzer is configured to compare the captured data to a model of the equipment, the model describing an expected state of the equipment; and determine, based on the comparison, that the equipment differs from the expected state. The communications interface is configured to transmit to an equipment manager data describing the current state of the equipment.

Embodiments of the present disclosure also provide for an equipment management system that includes a communications interface, an equipment analyzer, and a maintenance scheduler. The communications interface is configured to transmit an instruction to an autonomous vehicle (AV) to capture data describing equipment for servicing the AV, the AV comprising at least one sensor for capturing the data; and receive, from the AV, data captured by the at least one sensor, the data describing a current state of the equipment. The equipment analyzer is configured to compare the received data describing the current state of the equipment to a model of the equipment, the model describing an expected state of the equipment; and determine, based on the comparison, that the equipment differs from the expected state. The maintenance scheduler is configured to schedule maintenance for the equipment in response to the determination that the equipment differs from the expected state.

Embodiments of the present disclosure also provide for a method for inspecting equipment that includes instructing a sensor of an autonomous vehicle (AV) to capture data describing equipment for servicing the AV, the sensor selected from a plurality of sensors based on at least one of a type of equipment and a position of the equipment relative to the AV; receiving data captured by the sensor, the captured data describing a current state of the equipment for servicing the AV; comparing the captured data to a model of the equipment, the model describing an expected state of the equipment; and determining, based on the comparison, to perform maintenance on the equipment.

As will be appreciated by one skilled in the art, aspects of the present disclosure, in particular aspects of automated equipment inspection by AVs, described herein, may be embodied in various manners (e.g., as a method, a system, a computer program product, or a computer-readable storage medium). Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing perception system devices and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims and/or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The following disclosure describes various illustrative embodiments and examples for implementing the features and functionality of the present disclosure. While particular components, arrangements, and/or features are described below in connection with various example embodiments, these are merely examples used to simplify the present disclosure and are not intended to be limiting. It will of course be appreciated that in the development of any actual embodiment, numerous implementation-specific decisions must be made to achieve the developer's specific goals, including compliance with system, business, and/or legal constraints, which may vary from one implementation to another. Moreover, it will be appreciated that, while such a development effort might be complex and time-consuming; it would nevertheless be a routine undertaking for those of ordinary skill in the art having the benefit of this disclosure.

In the Specification, reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as "above", "below", "upper", "lower", "top", "bottom", or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions or other characteristics (e.g., time, pressure, temperature, length, width, etc.) of an element, operations, and/or conditions, the phrase "between X and Y" represents a range that includes X and Y.

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

Other features and advantages of the disclosure will be apparent from the following description and the claims.

Example AV Configured for Automated Equipment Inspection

Figure 1:
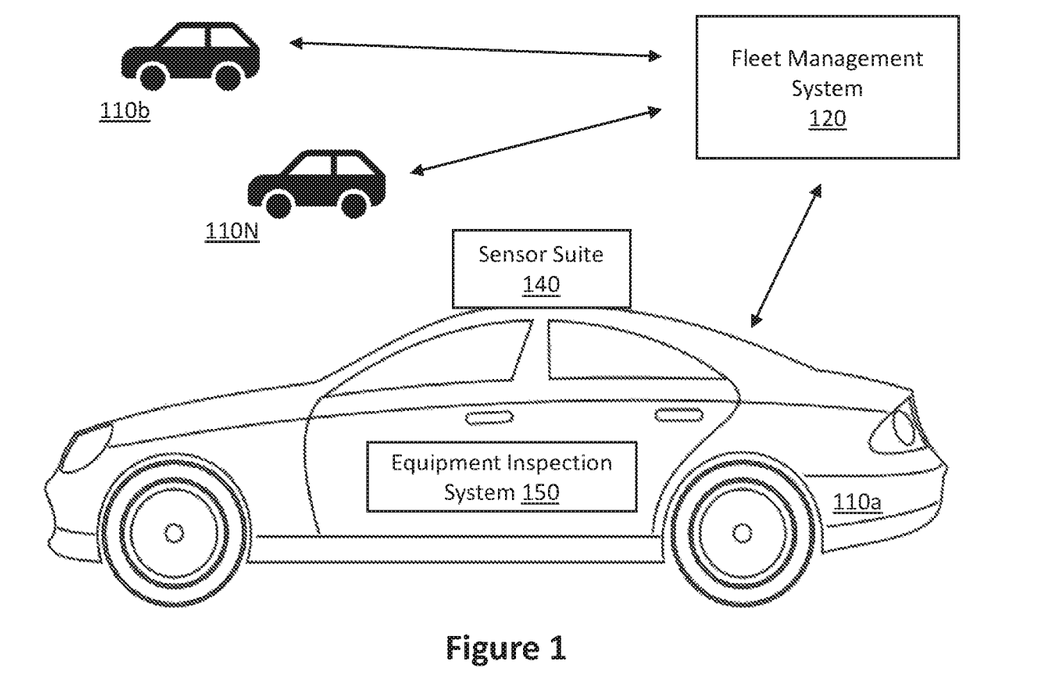
FIG. 1 is a block diagram illustrating a system including an example AV in which automated equipment inspection according to some embodiments of the present disclosure may be implemented.

FIG. 1 is a block diagram illustrating a system 100 including an example AV in which automated equipment inspection according to some embodiments of the present disclosure may be implemented. The system 100 includes a fleet of autonomous vehicles (AVs) 110, including AV 110a, AV 110b, and AV 110N, and a fleet management system 120. For example, a fleet of AVs may include a number N of AVs, e.g., AV 110a through AV 110N. AV 110a includes a sensor suite 140 and an equipment inspection system 150. AVs 110b through 110N also include the sensor suite 140 and the equipment inspection system 150. A single AV in the fleet is referred to herein as AV 110, and the fleet of AVs is referred to collectively as AVs 110. The equipment inspection system 150 enables an AV 110 to automatically inspect equipment to determine if the equipment needs servicing, e.g., if any parts are showing wear or need replacement, or if any aspects are malfunctioning. The fleet management system 120 may instruct AVs 110 to conduct equipment inspections, and the fleet management system 120 may automatically schedule equipment servicing and repairs based on the equipment inspections.

Each AV 110 is preferably a fully autonomous automobile, but may additionally or alternatively be any semi-autonomous or fully autonomous vehicle; e.g., a boat, an unmanned aerial vehicle, a driverless car, etc. Additionally, or alternatively, the AV 110 may be a vehicle that switches between a semi-autonomous state and a fully autonomous state and thus, the AV may have attributes of both a semi-autonomous vehicle and a fully autonomous vehicle depending on the state of the vehicle.

The AV 110 may include a throttle interface that controls an engine throttle, motor speed (e.g., rotational speed of electric motor), or any other movement-enabling mechanism; a brake interface that controls brakes of the AV (or any other movement-retarding mechanism); and a steering interface that controls steering of the AV (e.g., by changing the angle of wheels of the AV). The AV 110 may additionally or alternatively include interfaces for control of any other vehicle functions; e.g., windshield wipers, headlights, turn indicators, air conditioning, etc.

The AV 110 includes a sensor suite 140, which includes a computer vision ("CV") system, localization sensors, and driving sensors. For example, the sensor suite 140 may include photodetectors, cameras, radar sensors, sonar sensors, lidar sensors, thermal sensors, GPS, wheel speed sensors, inertial measurement units (IMUS), accelerometers, microphones, strain gauges, pressure monitors, barometers, thermometers, altimeters, ambient light sensors, etc. The sensors may be located in various positions in and around the AV 110. For example, the AV 110 may have multiple cameras located at different positions around the AV 110.

An onboard computer (not shown in FIG. 1) is connected to the sensor suite 140 and functions to control the AV 110 and to process sensed data from the sensor suite 140 and/or other sensors in order to determine the state of the AV 110. Based upon the vehicle state and programmed instructions, the onboard computer modifies or controls behavior of the AV 110. The onboard computer is preferably a general-purpose computer adapted for I/O communication with vehicle control systems and sensor suite 140, but may additionally or alternatively be any suitable computing device. The onboard computer is preferably connected to the Internet via a wireless connection (e.g., via a cellular data connection). Additionally or alternatively, the onboard computer may be coupled to any number of wireless or wired communication systems.

The equipment inspection system 150 inspects equipment, such as equipment used for servicing or maintenance of the AV 110. The equipment inspection system 150 obtains sensor data from one or more sensors of the sensor suite 140 and processes the sensor data to determine whether the equipment needs servicing. The equipment inspection system 150 may instruct the AV 110 (e.g., the onboard computer) to re-position the AV 110 and instruct the sensor suite 140 to capture additional data after the AV 110 is re-positioned. While the equipment inspection system 150 is shown as a component of the AV 110, in some embodiments, some or all components of the equipment inspection system 150 are implemented outside of the AV 110, e.g., in the fleet management system 120, at a cloud server, in an AV facility, etc. In the examples described herein, the equipment inspection system 150 inspects equipment for servicing AVs, such as vehicle charging stations, cleaning equipment, and vehicle maintenance equipment. In other examples, the equipment inspection system 150 is configured to inspect other types of equipment, including equipment not used by AVs. The equipment inspection system 150 is described further in relation to FIG. 2.

The fleet management system 120 manages the fleet of AVs 110. The fleet management system 120 may manage a service that provides or uses the AVs 110, e.g., a service for providing rides to users using the AVs 110, or a service that delivers items using AVs (e.g., prepared foods, groceries, packages, etc.). The fleet management system 120 may select an AV from a fleet of AVs to perform a particular service or other task, and instruct the selected AV (e.g., AV 110a) to drive to a particular location (e.g., a delivery address). The fleet management system 120 also manages fleet maintenance tasks, such as fueling, inspecting, and servicing of the AVs 110, and inspection and servicing of equipment for fueling and servicing the AVs 110. As shown in FIG. 1, each of the AVs 110 communicates with the fleet management system 120. The AVs 110 and fleet management system 120 may connect over a public network, such as the Internet. The fleet management system 120 is described further in relation to FIG. 3.

Example Equipment Inspection System

Figure 2:
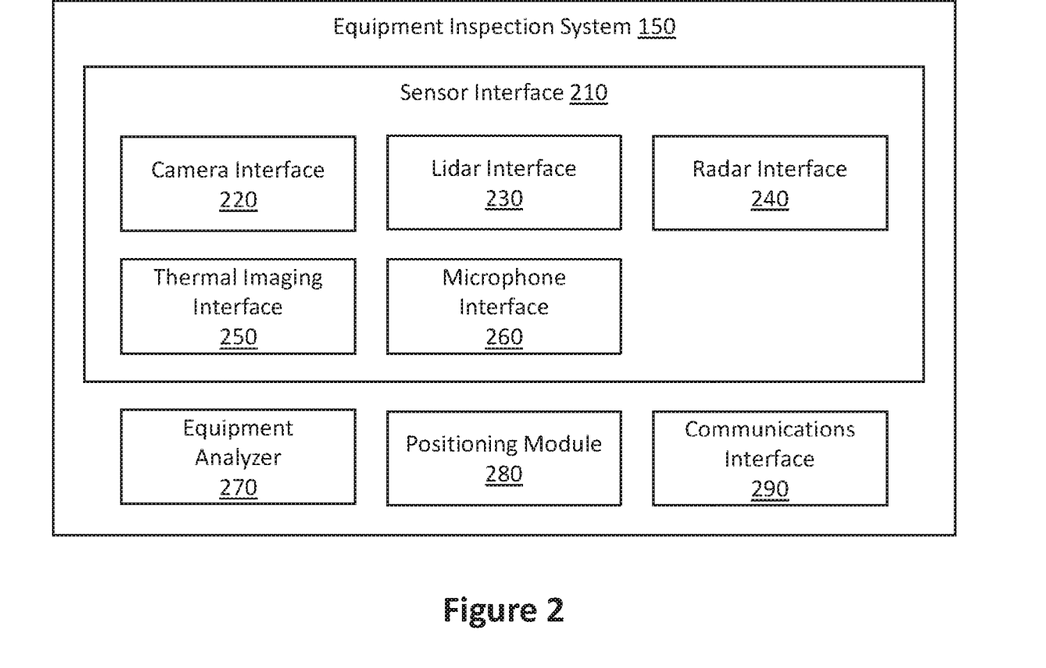
FIG. 2 is a block diagram illustrating an equipment inspection system according to some embodiments of the present disclosure.

FIG. 2 is a block diagram illustrating the equipment inspection system 150 according to some embodiments of the present disclosure. The equipment inspection system 150 includes a sensor interface 210, an equipment analyzer 270, a positioning module 280, and a communications interface 290. The sensor interface 210 includes a camera interface 220, a lidar interface 230, a radar interface 240, a thermal imaging interface 250, and a microphone interface 260. In alternative configurations, fewer, different and/or additional components may be included in the equipment inspection system 150. For example, in some configurations, the sensor interface 210 includes more, fewer, or different interfaces than those shown in FIG. 2, depending on the sensors included in the sensor suite 140. Further, functionality attributed to one component of the equipment inspection system 150 may be accomplished by a different component included in the equipment inspection system 150 or a different system than those illustrated. For example, in some embodiments, some elements of the equipment inspection system 150 may be implemented by a computer in an AV facility, by the fleet management system 120, or by another device.

The sensor interface 210 includes one or more interfaces to sensors of the sensor suite 140. The sensor interface 210 may request data from the sensor suite 140, e.g., by requesting that a sensor capture data in a particular direction (e.g., the direction of a piece of equipment, or at some element of the equipment), or at a particular time (e.g., when the AV 110 reaches the equipment). The sensor interface 210 is configured to receive data captured by at least one sensor of the sensor suite 140, including data describing a current state of equipment for servicing the AV. The sensor interface 210 may have subcomponents for interfacing with individual sensors or groups of sensors of the sensor suite 140, as shown in FIG. 2. In this example, the sensor interface 210 includes a camera interface 220, a lidar interface 230, a radar interface 240, a thermal imaging interface 250, and a microphone interface 260.

The camera interface 220 interfaces with one or more cameras in the sensor suite 140. The cameras are configured to capture images, e.g., an image of at least a portion of the equipment, and provide the captured images to the camera interface 220. The sensor suite 140 may include multiple cameras to capture different views, e.g., a front-facing camera, a back-facing camera, and side-facing cameras. The cameras may be implemented using high-resolution imagers with fixed mounting and field of view. The camera interface 220 may select a camera of the sensor suite 140 based on the relative position of the AV 110 and the equipment and instruct the selected camera to capture an image of the equipment. The camera interface 220 may instruct the camera to zoom in or zoom out, or to pan to a particular field of view, e.g., to capture one or more images of a particular portion of the equipment.

The lidar interface 230 interfaces with a lidar (light detection and ranging) sensor in the sensor suite 140. The lidar sensor is configured to measure distances to objects in the vicinity of the AV 110 using reflected laser light. The lidar sensor may be a scanning lidar that provides a point-cloud of the region scanned to the lidar interface 230. In the context of equipment inspection, the lidar sensor may capture accurate three-dimensional data describing the shape of the equipment or a portion of equipment, which can be used to determine if equipment has been bent, is wearing out, is broken, or is otherwise misshapen. The lidar sensor may have a dynamically configurable field of view, and the lidar interface 230 may instruct the lidar sensor to capture a point cloud of a particular field of view, e.g., to capture a point cloud that describes the equipment or a particular portion of the equipment.

The radar interface 240 interfaces with a radar sensor in the sensor suite 140. The radar sensor is configured to measure ranges and speeds of objects in the vicinity of the AV 110 using reflected radio waves. The sensor suite 140 may include one or more articulating radar sensors, long-range radar sensors, short-range radar sensors, or some combination thereof. In the context of equipment inspection, the radar sensor may be useful for detecting the presence of metal, e.g., if metallic parts have become lodged in cleaning equipment. The radar sensor may be implemented using a scanning radar with a dynamically configurable field of view, and the radar interface 240 may instruct the radar sensor to capture data from a particular field of view, e.g., to capture data describing the equipment or a particular portion of the equipment.

The thermal imaging interface 250 interfaces with a thermal sensor in the sensor suite 140. The thermal sensor is configured to capture thermal images describing heat emitted by objects, e.g., by a piece of equipment or portion of equipment, and provide the thermal images to the thermal imaging interface 250. The thermal sensor may be configured to detect infrared or long-infrared radiation, e.g., radiation having a wavelength in the range of around 9000 nanometers to around 14000 nanometers. In the context of equipment inspection, the thermal imaging sensor may be useful for determining if heat-conducting equipment, such as a charging station, is emitting radiation outside of an expected range, indicating that the equipment or some component may be overheating or is not operational. The thermal sensor may have a dynamically configurable field of view, and the thermal imaging interface 250 may instruct the thermal sensor to capture a thermal image of a particular field of view, e.g., to capture a thermal image of the equipment or a particular portion of the equipment.

The microphone interface 260 interfaces with a microphone in the sensor suite 140. The microphone is configured to convert sound in the vicinity of the AV 110 into an electrical signal that the microphone provides to the microphone interface 260. In the context of equipment inspection, the microphone interface 260 may instruct the microphone to capture sounds when a piece of equipment is turned on or is performing a particular operation associated with an expected sound. As an example, a microphone can capture sound from a vacuum, which can be used to determine if the vacuum is generating audible suction. The sensor suite 140 may have multiple microphones at various locations around the AV 110, and the microphone interface 260 selects a microphone of the sensor suite 140 based on the relative position of the AV 110 and the equipment and instructs the selected microphone to capture sound.

The equipment analyzer 270 receives data from the sensor interface 210, e.g., data from one or more of the interfaces 220-260 that was captured by one or more corresponding sensors of the sensor suite 140 and that describes a current state of equipment, e.g., equipment for servicing the AV. The equipment analyzer 270 compares the captured data to a model of the equipment describing an expected state of the equipment. For example, the equipment analyzer 270 compares an image and/or point cloud of a charging station plug to a model of the plug. The equipment analyzer 270 determines, based on the comparison, if the equipment differs from the model. For example, the equipment analyzer 270 analyzes the positions of each of the pins of the charging station plug to determine of any is misaligned by at least a threshold amount.

The equipment analyzer 270 includes models based on data that correspond to the sensors included in the sensor suite 140 and the interfaces included in the sensor interface 210. For example, if one of the sensors in the sensor suite 140 is a camera and the equipment inspection system 150 includes a camera interface 220, the captured data may include an image of at least a portion of the equipment, and the model is based on an expected image of the equipment. As another example, if one of the sensors in the sensor suite 140 is a lidar sensor and the equipment inspection system 150 includes a lidar interface 230, the captured data may include a point cloud describing a shape of at least a portion of the equipment, and the model includes an expected shape of the equipment. As still another example, if one of the sensors in the sensor suite 140 is a thermal sensor and the equipment inspection system 150 includes a thermal imaging interface 250, the captured data may include a thermal image describing heat emitted by the equipment or a portion of the equipment, and the model includes an expected thermal image of the equipment.

In some embodiments, the model of the equipment is trained using machine-learning. For example, the model of the equipment may be a binary classification model trained based on training data obtained by AV sensor suites of examples of the equipment. The training data includes data captured by AV sensors of example equipment in an expected state (e.g., equipment that is known to be functioning properly) and data captured by AV sensors of example equipment in one or more damaged states that are different from the expected state. The training data may include labels for various damaged states that indicate known failure modes. In some embodiments, the model of the equipment is or includes a multi-class classifier trained based on the data labeled with the different damaged states; the multi-class classifier can identify a failure mode based on captured data describing the equipment.

In one example, the model is trained based on data labeled as showing evidence various levels of wear, e.g., data labeled by an expected remaining service duration before the equipment or part fails. In an embodiment, captured data is collected for a set of example parts over a period of time, and when each example part fails, the previously captured data is labeled based on the actual failure date of the part, and optionally labeled with the failure mode if the part has several potential modes of failure. For example, sample data is captured for a set of sample charging stations plugs on a weekly basis to capture wear patterns across the plugs. The model trained based on this sample wear pattern data can be used to estimate a wear level of similar plugs.

The equipment analyzer 270 may include multiple models, each for analyzing a different type of equipment or a different part. In addition, different models may be constructed using data from different sensors or combination of sensors. For example, the equipment analyzer 270 may have one model for analyzing thermal images of a charging station, and the equipment analyzer 270 compares a thermal image of a charging station received from the thermal imaging interface 250 to the charging station thermal model to determine if the charging station is functioning properly. As another example, the equipment analyzer 270 may have a model for analyzing a charging station plug that is built on both images captured by a camera and a point cloud captured by a lidar sensor; the equipment analyzer 270 inputs captured images and lidar data received from the camera interface 220 and lidar interface 230 into the charging station plug model. As another example, the equipment analyzer 270 has a database of sound files associated with different equipment conditions or failure modes; the equipment analyzer 270 compares a sound captured by the microphone and received from the microphone interface 260 to one or more sound models.

In some embodiments, the equipment analyzer 270 instructs one or more of the interfaces 220-260 to request captured data based on the equipment being inspected. In one example, the AV 110 routinely inspects a charging station plug prior to charging. When the AV 110 reaches the charging station, the equipment analyzer 270 instructs the lidar interface 230 to request that the lidar sensor obtain a point cloud describing the shape of the plug. As another example, the AV 110 plugs into the charging station, but a battery sensor in the AV 110 determines that no charge is being received from the charging station. The equipment analyzer 270 receives a signal from the battery sensor and in response, the equipment analyzer 270 instructs the camera interface 220 to obtain an image of the charging station, which includes a display screen that may output error information. The equipment analyzer 270 may be configured to extract text from the display screen image and identify an error associated with the extracted text.

The positioning module 280 provides instructions to position the AV 110 relative to the equipment such that the field of view of one or more sensors of the sensor suite 140 include the equipment or a specific portion or part of the equipment. The positioning module 280 receives information describing the position of the AV 110 and/or information describing the location and field of view of one or more sensors, and, based on this information, determines a maneuver or set of maneuvers to be performed by the AV 110 so that the sensor(s) capture the equipment or desired part or portion of equipment.

In some embodiments, the positioning module 280 determines a sequence of maneuvers so that the sensor(s) can capture the equipment from multiple angles, e.g., to capture different sides of the equipment, or to capture different portions of the equipment. In such embodiments, the positioning module 280 provides instructions to re-position the AV 110 relative to the equipment. For example, the positioning module 280 provides instructions to position the AV 110 such that a lidar sensor can capture a point cloud describing a charging station plug, and then provides instructions to re-position the AV 110 so that a camera can capture an image of a display screen of the charging station. As another example, the equipment analyzer 270 determines that a first set of captured data cannot be compared to the model, e.g., because the equipment is obscured, or the captured data is noisy or of low resolution. The positioning module 280 provides instructions to re-position the AV 110, and the sensor interface 210 receives a second set of data captured from the new position.

The communications interface 290 enables the equipment inspection system 150 to communicate with other systems or servers. The communications interface 290 is configured to transmit to an equipment manager, e.g., an equipment manager of the fleet management system 120, data describing the current state of the equipment. The communications interface 290 may receive instructions from the fleet management system 120 to inspect equipment in the vicinity of the AV 110, or to inspect equipment before the AV 110 uses the equipment.

The communications interface 290 may provide various outputs of the equipment analyzer 270 to the fleet management system 120. In one embodiment, the equipment analyzer 270 determines that equipment needs servicing, and the communications interface 290 transmits a service request to the fleet management system 120. In another embodiment, the equipment analyzer 270 determines a wear level of the equipment, and the communications interface 290 transmits the wear level to the fleet management system 120. The communications interface 290 may transmit captured data describing the equipment, or a portion of the captured data, to the fleet management system 120. For example, the communications interface 290 transmits a captured image of an equipment display screen to the fleet management system 120. As another example, the communications interface 290 transmits captured data describing a current state of equipment in response to determining that the equipment differs from the expected state, and does not transmit the captured data in response to determining that the equipment does not differ from the expected state.

Example Fleet Management System

Figure 3:
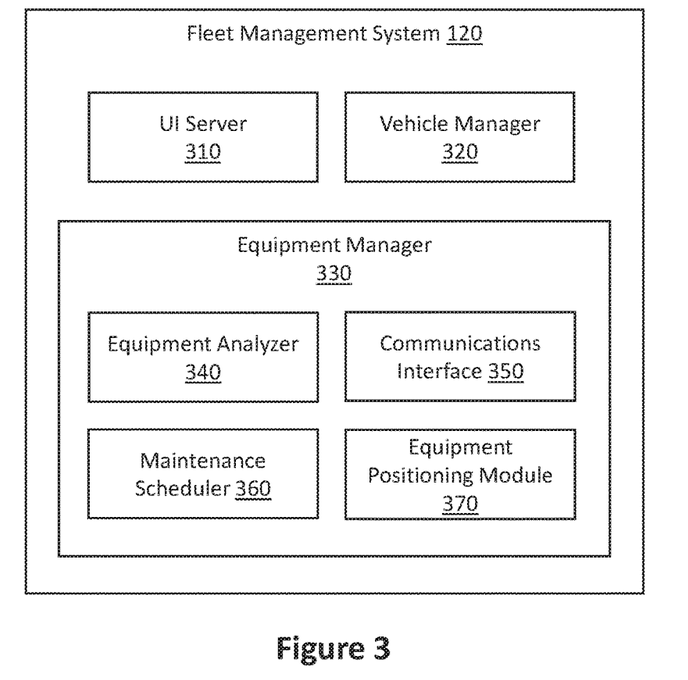
FIG. 3 is a block diagram illustrating a fleet management system according to some embodiments of the present disclosure.

FIG. 3 is a block diagram illustrating the fleet management system 120 according to some embodiments of the present disclosure. The fleet management system 120 includes a UI (user interface) server 310, a vehicle manager 320, and an equipment manager 330. The equipment manager 330 includes an equipment analyzer 340, a communications interface 350, a maintenance scheduler 360, and an equipment positioning module 370. In alternative configurations, different and/or additional components may be included in the fleet management system 120. Further, functionality attributed to one component of the fleet management system 120 may be accomplished by a different component included in the fleet management system 120 or a different system than those illustrated. For example, in some embodiments (such as the embodiment described with respect to FIG. 2), the equipment analyzer 340 is implemented by the equipment inspection system 150 of the AV 110. In some embodiments, both the equipment inspection system 150 and the equipment manager 330 have an equipment analyzer. As another example, in some embodiments, the equipment positioning module 370 is implemented by the equipment, or by an equipment manager located at the AV facility that includes the equipment.

The UI server 310 is configured to communicate with client devices that provide a user interface to users. For example, the UI server 310 may be a web server that provides a browser-based application to client devices, or the UI server 310 may be a mobile app server that interfaces with a mobile app installed on client devices. The user interface enables the user to access a service of the fleet management system 120, e.g., to request a ride from an AV 110, or to request a delivery from an AV 110.

The vehicle manager 320 manages and communicates with a fleet of AVs, including AVs 110a through 110N. The vehicle manager 320 may assign AVs 110 to various tasks and direct the movements of the AVs 110 in the fleet. For example, the vehicle manager 320 assigns an AV 110 to perform a service requested by a user to the UI server 310. The vehicle manager 320 may instruct AVs 110 to drive to other locations while not servicing a user, e.g., to improve geographic distribution of the fleet, to anticipate demand at particular locations, etc. The vehicle manager 320 also instructs AVs 110 to return to AV facilities for fueling, inspection, maintenance, or storage. The vehicle manager 320 may instruct an AV 110 to perform an inspection of equipment, e.g., equipment at an AV facility for servicing AVs. In some embodiments, the vehicle manager 320 instructs an additional AV located at the AV facility to assist in the inspection being performed by the AV 110. For example, the vehicle manager 320 instructs an additional AV to capture additional data of the equipment from another angle, or instructs the additional AV to turn on its headlight to improve visibility of the equipment in images captured by the AV 110.

The equipment manager 330 manages equipment operated by the fleet management system 120. For example, the fleet management system 120 manages AV facilities that include various equipment for servicing the AVs 110, such as charging stations, car washes, vacuums, other cleaning equipment, and equipment for performing routine maintenance, such as tire changes, oil changes, and parts replacements. For routine service and maintenance operations that are automated, the equipment manager 330 may also manage equipment used for automating tasks, such as robotic arms for maneuvering charging station plugs, vacuums, and other equipment that is typically hand-held, along with automated car washes, automated vehicle lifts, and other automated systems.

The equipment manager 330 may maintain a database of equipment managed by the equipment manager 330. For each piece of equipment, the database stores data describing the type of equipment, location of equipment, and status of equipment, including whether the equipment is operational, and any planned servicing of the equipment. The vehicle manager 320 may reference this database to identify equipment for servicing an AV 110. For example, if the equipment database indicates that a particular charging station is not operational, the vehicle manager 320 instructs an AV 110 to navigate to and receive charge from a different charging station.

The equipment analyzer 340 analyzes captured data describing equipment to determine if the equipment is in an expected state or not. The equipment analyzer 340 may be similar to the equipment analyzer 270, described above. In some embodiments, the communications interface 290 of the equipment inspection system 150 transmits data captured by the sensor suite 140 and received by the sensor interface 210 to the fleet management system 120 for analysis, and the equipment analyzer 340 compares the captured data describing the current state of the equipment to a model describing an expected state of the equipment, as described above with respect to equipment analyzer 270.

In some embodiments, both the equipment inspection system 150 and the fleet management system 120 include equipment analyzers 270 and 340, respectively. For example, the equipment analyzer 270 is configured to determine if equipment differs from an expected state, and in response, the communications interface 290 transmits at least a portion of the captured data to the fleet management system 120. The equipment analyzer 340 may be configured to perform additional analysis on the captured data, e.g., to identify a particular failure mode, or to identify a wear level and predict a remaining service duration for the equipment based on the wear level. In some embodiments, the equipment analyzer 340 is configured to identify additional data that can be used to identify the failure mode, predict the remaining service duration, or meet some other objective, and request that the sensor suite 140 of the AV 110 and/or the sensor suite of another AV in the AV facility gather the additional data. For example, if the equipment analyzer 340 determines that audio information describing the sound that a piece of equipment is making may identify a failure mode for a given piece of equipment, the equipment analyzer 340 requests that the microphone interface 260 of the AV 110 request capture of audio data and return the audio data to the fleet management system 120; the equipment analyzer 340 compares the captured audio data to an audio model (e.g., one or more audio files) to identify a failure mode. As another example, if the equipment analyzer 340 receives an indication from the equipment inspection system 150 that a piece of equipment having a display screen is not operating properly, the equipment analyzer 340 requests that the camera interface 220 receive an image of the display screen and transmit the image to the fleet management system 120; the equipment analyzer 340 identifies an error in the equipment based on the image of the captured display screen, e.g., by performing text recognition on the captured image.

The communications interface 350 enables the equipment manager 330 to communicate with other systems or servers, including the fleet of AVs 110. The communications interface 350 is configured to receive, from the AV 110, data captured by at least one sensor of the AV 110 describing the current state of the equipment. The communications interface 350 may transmit instructions from the equipment manager 330 to inspect equipment in the vicinity of the AV 110, or to inspect equipment before the AV 110 uses the equipment.

The maintenance scheduler 360 schedules maintenance of the equipment in response to a determination that the equipment is not its expected state, e.g., that the equipment differs from the expected state. The maintenance scheduler 360 may schedule maintenance tasks based on data from the equipment analyzer 340 indicating an identified failure mode. The maintenance scheduler 360 may schedule a date and time for the maintenance based on the equipment condition, which may include whether the equipment is still operational, and if so, an estimated remaining service duration for the equipment. The maintenance scheduler 360 may further schedule the maintenance date and time based on repair technician availability, parts availability, the urgency of the repair (e.g., if the equipment is dangerous in its present condition), the usage levels of the equipment (e.g., infrequently used equipment or redundant equipment can be repaired later than frequently used or unique equipment), or other factors or combination of factors. The maintenance scheduler 360 may automatically determine parts or tools used for servicing the equipment, and submit a request for the part or tools to be delivered to the AV facility. The communications interface 350 may submit a parts request to a parts warehouse, a parts supplier, or another source of parts.

The equipment positioning module 370 is configured to instruct an actuator within the AV facility and associated with the equipment to re-position at least a portion of the equipment to a second position. For example, the equipment positioning module 370 manages a robotic arm used to move a charging station cable and plug the charging station plug into the AV 110. The equipment positioning module 370 may instruct the robotic arm to maneuver the plug to a particular position for inspection by the AV 110. In some embodiments, the robotic arm is configured to operate independently when performing certain motions, such as plugging the charging station into the AV 110 and unplugging the charging station from the AV 110, but the robotic arm can be remotely operated by the equipment positioning module 370, e.g., in response to the equipment analyzer 340 requesting to view the plug from a particular angle. The equipment positioning module 370 can similarly control other actuators, e.g., moving elements of a car wash or robotic arms for vacuums. The equipment analyzer 340 is configured to analyze data captured from different positions of equipment relative to the AV 110.

Example Use Case for Equipment Inspection System

Figure 4:
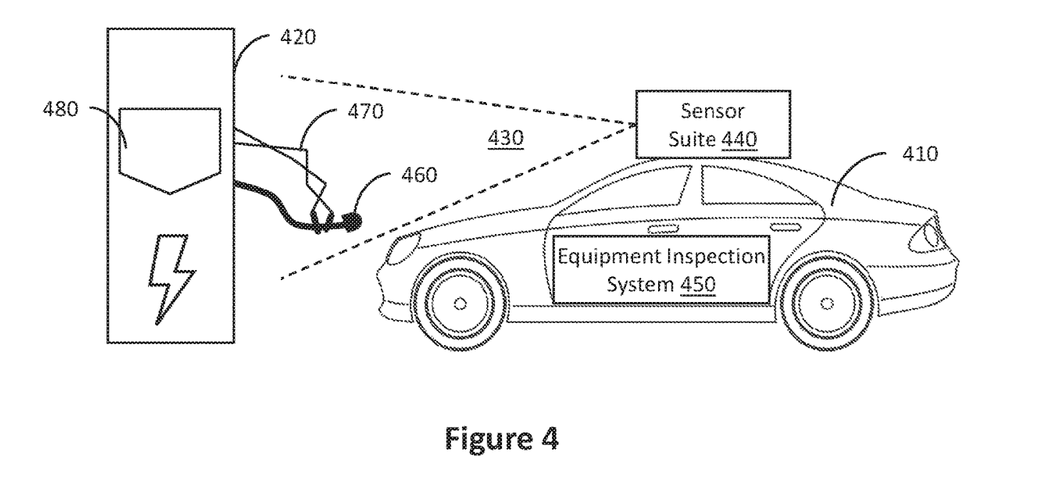
FIG. 4 illustrates an example use case of an AV inspecting a charging station according to some embodiments of the present disclosure.

FIG. 4 illustrates an example use case of an AV inspecting a charging station according to some embodiments of the present disclosure. In this example, an AV 410 is inspecting a charging station 420. The AV 410 is a battery-powered electric vehicle that is charged by the charging station 420. The AV 410 has a sensor suite 440, which is similar to the sensor suite 140 described above. One or more sensors of the sensor suite 440 have a field of view 430 that includes a portion of the charging station 420. The AV 410 further includes an equipment inspection system 450, which is similar to the equipment inspection system 150 described above. The equipment inspection system 450 receives data captured by the sensor suite 440 of the field of view 430. For example, the equipment inspection system 450 receives a thermal image captured by a thermal sensor of the sensor suite 440 and a point cloud captured by a lidar sensor of the sensor suite 440.

The charging station 420 includes a plug 460 for plugging the charging station 420 into the AV 410. The position of the plug 460 is controlled by a robotic arm 470. The robotic arm 470 is configured to insert the plug 460 into a receptacle on the AV 410 to initiate charging, and to remove the plug 460 from the receptacle after the AV 410 has been charged. The charging station 420 further includes a display screen 480. If the charging station 420 identifies an error, the charging station 420 may output an error code or other information describing the error on the display screen 480.

The equipment inspection system 450 can analyze various aspects of the charging station 420 based on data captured by the sensor suite 440. For example, the equipment inspection system 450 compares the thermal image captured by the thermal sensor of the sensor suite 440 to a heat model of the charging station 420 and determines if the thermal image indicates that the charging station 420 has an unusual pattern of heat emission, e.g., of the charging station 420 or a portion of the charging station is too hot. The equipment inspection system 450 may account for conditions that alter the heat of the charging station 420, e.g., a hot or cool ambient temperature, or recent use of the charging station 420. In response to determining that the charging station 420 has an unusual pattern of heat emission, a positioning module of the equipment inspection system 450 (similar to positioning module 280, described above) may maneuver the AV 410 to better view the display screen 480. After the AV 410 maneuvers, a camera of the sensor suite 440 captures an image of the display screen 480. The equipment inspection system 450 transmits the image of the display screen and the thermal image and/or data describing the heat emission pattern to the equipment manager 330.

As another example, the equipment inspection system 450 compares a point cloud describing the plug 460 to a model of a plug and determines that the plug 460 is experiencing wear, e.g., some pins on the plug 460 have some mild misalignment. In some embodiments, the equipment inspection system 450 requests that the robotic arm 470 maneuver the plug 460 so that the lidar sensor can capture a better view of the plug 460. For example, the communications interface 290 transmits a maneuver request to the robotic arm 470. Alternatively, the communications interface 290 transmits a maneuver request to the equipment manager 330, which relays the maneuver request to the robotic arm 470. Alternatively, the communications interface 290 transmits the captured point cloud to the equipment manager 330, the equipment analyzer 340 determines that a point cloud describing the plug 460 and captured from a different angle would be useful, and the equipment positioning module 370 instructs the maneuver request to the robotic arm 470. In response to the maneuver request, the robotic arm 470 moves the plug, and the equipment inspection system 450 receives a second point cloud captured by the sensor suite 440 (e.g., a lidar sensor), compares the second point cloud to the model of a plug, and determines whether the plug 460 is experiencing wear or is damaged or broken.

Example Method for Inspecting Equipment

Figure 5:
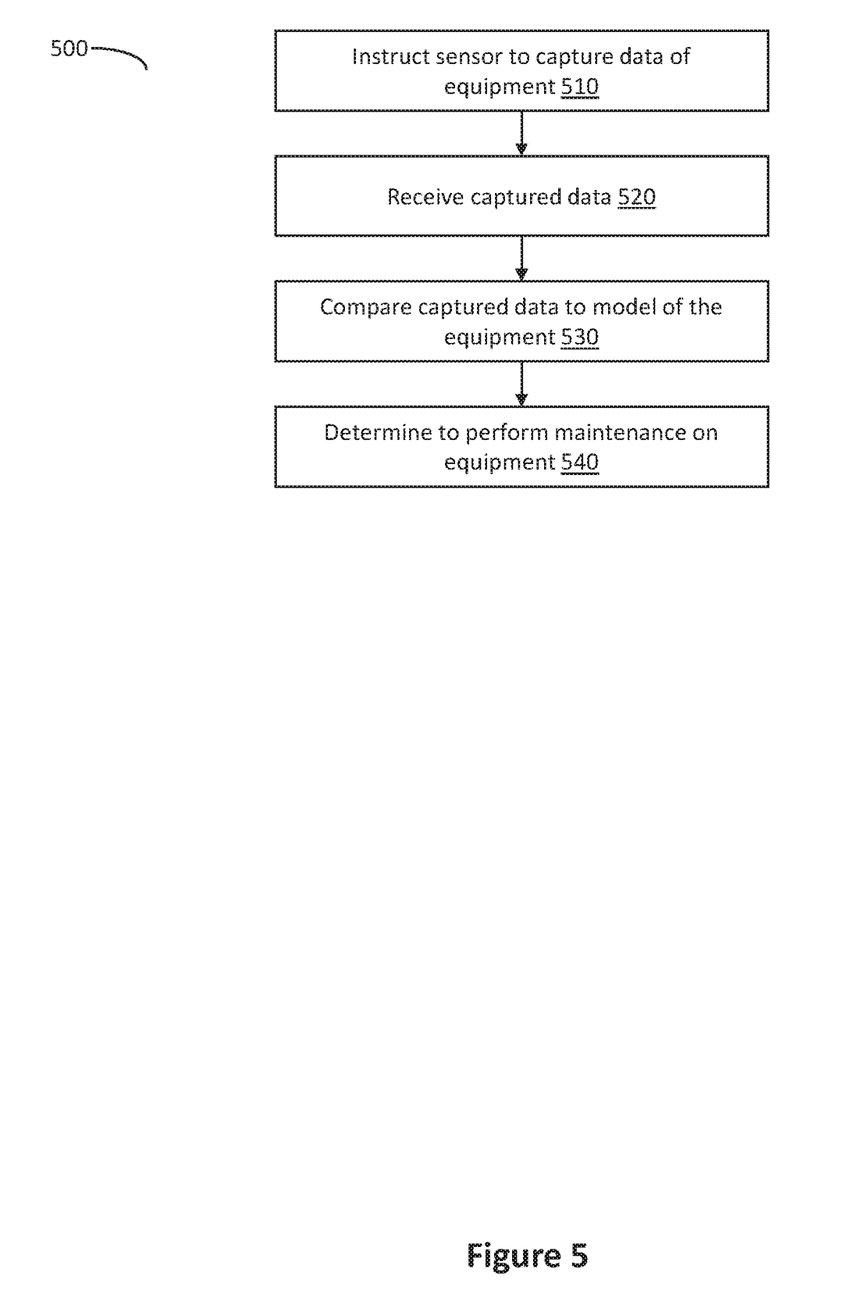
FIG. 5 is a flowchart of an example method for automated equipment inspection according to some embodiments of the present disclosure.

FIG. 5 is a flowchart of an example method for automated equipment inspection according to some embodiments of the present disclosure. An equipment analyzer, such as equipment analyzer 270 or equipment analyzer 340, instructs 510 a sensor to capture data of equipment, e.g., equipment for servicing an AV. The sensor may be selected from a plurality of sensors in an AV sensor suite (e.g., sensor suite 140) based on at least one of a type of equipment and a position of the equipment relative to the AV 110. For example, to inspect equipment that has a display screen, the equipment analyzer determines that the AV 110 should obtain a visual image of the equipment, and the equipment analyzer selects a camera that is positioned with the equipment in its field of view. A sensor interface 210 transmits the instruction to the selected sensor.

The equipment analyzer (e.g., equipment analyzer 270 or equipment analyzer 340) receives 520 the captured data, which describes a current state of the equipment. The equipment analyzer receives the captured data via the sensor interface 210. The equipment analyzer compares 530 the captured data to a model of the equipment. The model of the equipment describes an expected state of the equipment. For example, the equipment analyzer uses the model to determine that the current state of the equipment matches the expected state or not. The equipment analyzer may additionally or alternatively use the model or another model to determine if the current state of the equipment matches a failure mode or wear pattern.

The equipment analyzer determines 540 to perform maintenance on the equipment based on the comparison. The equipment analyzer may transmit information to the maintenance scheduler 360 indicating that the equipment is not in the expected state, and any information describing a detected failure mode. In response, the maintenance scheduler 360 schedules the equipment for maintenance and provides data about the equipment to a repair technician.

SELECT EXAMPLES

Example 1 provides a system for inspecting equipment by an AV including a camera interface configured to instruct a sensor interface, and equipment analyzer, and a communications interface. The sensor interface is configured to receive data captured by at least one sensor, the captured data describing a current state of equipment for servicing the AV. The equipment analyzer is configured to compare the captured data to a model of the equipment, the model describing an expected state of the equipment, and determine, based on the comparison, that the equipment differs from the expected state. The communications interface is configured to transmit to an equipment manager data describing the current state of the equipment.

Example 2 provides the system of according to example 1, where the at least one sensor is located at a first position relative to the equipment, the system further includes positioning module configured to maneuver the AV so that the at least one sensor is located at a second position relative to the equipment, and the equipment analyzer is configured to compare data captured by the at least one sensor at the second position relative to the equipment to the model of the equipment.

Example 3 provides the system according to example 1 or 2, where the model of the equipment is trained using machine-learning to classify the equipment as being in the expected state or being in a damaged state that differs from the expected state, the model trained by a first data set describing the equipment in the expected state and at least one second data set describing the equipment in the damaged state.

Example 4 provides the system according to any of the preceding examples, where equipment analyzer is further configured to determine a wear level of the equipment based on the data describing the current state of the equipment, and the communications interface is further configured to transmit the wear level to the equipment manager, the equipment manager configured to determine a predicted remaining service duration for the equipment based on the wear level.

Example 5 provides the system according to any of the preceding examples, where the equipment includes a display screen, the sensor data includes an image of the display screen, and the communications interface is configured to transmit the image of the display screen to the equipment manager.

Example 6 provides the system according to any of the preceding examples, where the equipment is a connector of an AV charging station, the connector configured to plug into the AV to charge the AV, the model describes an expected state of the connector.

Example 7 provides the system according to any of the preceding examples, where the at least one sensor includes a camera, the data captured by the at least one sensor includes an image of at least a portion of the equipment, and the model is based on an expected image of the equipment.

Example 8 provides the system according to any of the preceding examples, where the at least one sensor includes a lidar sensor, the data captured by the at least one sensor includes a point cloud describing a shape of at least a portion of the equipment, and the model includes an expected shape of the equipment.

Example 9 provides the system according to any of the preceding examples, where the at least one sensor includes a thermal sensor, the data captured by the at least one sensor includes a thermal image describing heat emitted by at least a portion of the equipment, and the model includes at least one expected thermal image of the equipment.

Example 10 provides an equipment management system that includes a communications interface, an equipment analyzer, and a maintenance scheduler. The communications interface is configured to transmit an instruction to an AV to capture data describing equipment for servicing the AV, the AV including at least one sensor for capturing the data; and receive, from the AV, data captured by the at least one sensor, the data describing a current state of the equipment. The equipment analyzer is configured to compare the received data describing the current state of the equipment to a model of the equipment, the model describing an expected state of the equipment; and determine, based on the comparison, that the equipment differs from the expected state. The maintenance scheduler is configured to schedule maintenance for the equipment in response to the determination that the equipment differs from the expected state.

Example 11 provides the system according to example 10, where the AV is located at a first position relative to the equipment, the AV includes a positioning module configured to maneuver the AV from the first position to a second position relative to the equipment, and the equipment analyzer is further configured to compare data captured by the at least one sensor of the AV at the second position relative to the equipment.

Example 12 provides the system according to example 10 or 11, where the equipment is located at a first position relative to the AV, the equipment management system further includes an equipment positioning module configured to instruct an actuator to reposition at least a portion of the equipment to a second position relative to the AV, and the equipment analyzer is further configured to compare data captured by the at least one sensor of the AV of the equipment at the second position relative to the AV.

Example 13 provides the system according to any of examples 10 through 12, where the model of the equipment is trained using machine-learning to classify the equipment as being in the expected state or being in a damaged state that differs from the expected state, the model trained by a first data set describing the equipment in the expected state and at least one second data set describing the equipment in the damaged state.

Example 14 provides the system according to any of examples 10 through 13, where the equipment analyzer is further configured to determine a wear level of the equipment based on the data describing a current state of the equipment, and determine a predicted remaining service duration for the equipment based on the wear level.

Example 15 provides the system according to example 14, where the maintenance scheduler is configured to schedule maintenance for the equipment based on the predicted remaining service duration for the equipment.

Example 16 provides the system according to any of examples 10 through 15, where the equipment includes a display screen, the sensor data includes an image of the display screen, and the equipment analyzer is further configured to identify an error in the equipment based on the image of the display screen.

Example 17 provides a method for inspecting equipment that includes instructing a sensor of an AV to capture data describing equipment for servicing the AV, the sensor selected from a plurality of sensors based on at least one of a type of equipment and a position of the equipment relative to the AV; receiving data captured by the sensor, the captured data describing a current state of the equipment for servicing the AV; comparing the captured data to a model of the equipment, the model describing an expected state of the equipment; and determining, based on the comparison, to perform maintenance on the equipment.

Example 18 provides the method according to example 17, further including scheduling maintenance for the equipment in response to the determination to perform maintenance on the equipment, and directing a second AV of a fleet of AVs to use alternate equipment for servicing the second AV prior to the scheduled maintenance.

Example 19 provides the method according to example 17 or 18, where the sensor is located at a first position relative to the equipment, and the method further includes maneuvering the AV so that the sensor is located at a second position relative to the equipment; receiving additional data captured by the sensor at the second position relative to the equipment; comparing the additional data to the model of the equipment; and determining, based on the comparison of the additional data to the model, that the equipment differs from the expected state.

Example 20 provides the method according to any of examples 17 through 19, the method further including determining a wear level of the equipment based on the captured data describing the current state of the equipment, and determining a predicted remaining service duration for the equipment based on the wear level.

Other Implementation Notes, Variations, and Applications

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

In one example embodiment, any number of electrical circuits of the figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more components. However, this has been done for purposes of clarity and example only. It should be appreciated that the system can be consolidated in any suitable manner. Along similar design alternatives, any of the illustrated components, modules, and elements of the FIGS. may be combined in various possible configurations, all of which are clearly within the broad scope of this Specification.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the systems and methods described above may also be implemented with respect to the methods or systems described herein and specifics in the examples may be used anywhere in one or more embodiments.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph (f) of 35 U.S.C. Section 112 as it exists on the date of the filing hereof unless the words "means for" or "step for" are specifically used in the particular claims; and (b) does not intend, by any statement in the Specification, to limit this disclosure in any way that is not otherwise reflected in the appended claims.

What is claimed is:

1. A system for inspecting equipment by an autonomous vehicle (AV) comprising:
   a sensor interface to:
      receive first data captured by a sensor while the sensor is located at a first position relative to equipment for servicing the AV, the first data describing a current state of the equipment for servicing the AV, and
      receive second data captured by the sensor while the sensor is located at a second position relative to the equipment for servicing the AV, the second data further describing the current state of the equipment for servicing the AV;
   a processor to:
      compare the first data and the second data to a model of the equipment for servicing the AV, the model describing an expected state of the equipment for servicing the AV, and
      determine, based on the comparison, that the equipment for servicing the AV differs from the expected state;
   an onboard computer of the AV to cause the AV to maneuver so that the sensor is located at the second position relative to the equipment for servicing the AV; and
   a communications interface to transmit, to an equipment manager, data describing the current state of the equipment for servicing the AV.

2. The system of claim 1, wherein the model of the equipment for servicing the AV is trained using machine-learning to classify the equipment for servicing the AV as being in the expected state or being in a damaged state that differs from the expected state, the model trained by a first training data set describing the equipment for servicing the AV in the expected state and at least one second training data set describing the equipment for servicing the AV in the damaged state.

3. The system of claim 1, wherein the processor is further to determine a wear level of the equipment for servicing the AV based on the first data describing the current state of the equipment for servicing the AV, and the communications interface is further to transmit the wear level to the equipment manager, the equipment manager to determine a predicted remaining service duration for the equipment for servicing the AV based on the wear level.

4. The system of claim 1, wherein the equipment for servicing the AV comprises a display screen, the first data comprises an image of the display screen, and the communications interface is to transmit the image of the display screen to the equipment manager.

5. The system of claim 1, wherein the equipment for servicing the AV is a connector of an AV charging station, the connector to plug into the AV to charge the AV, and the model describes an expected state of the connector.

6. The system of claim 1, wherein the sensor comprises a camera, the first data captured by the sensor comprises an image of at least a portion of the equipment for servicing the AV, and the model is based on an expected image of the equipment.

7. The system of claim 1, wherein the sensor comprises a lidar sensor, the first data captured by the sensor comprises a point cloud describing a shape of at least a portion of the equipment for servicing the AV, and the model comprises an expected shape of the equipment for servicing the AV.

8. The system of claim 1, wherein the sensor comprises a thermal sensor, the first data captured by the sensor comprises a thermal image describing heat emitted by at least a portion of the equipment for servicing the AV, and the model comprises at least one expected thermal image of the equipment for servicing the AV.

9. An equipment management system comprising:
   a communications interface to:
      transmit a first instruction to an autonomous vehicle (AV) to capture first data describing equipment for servicing the AV, the AV comprising a sensor for capturing the first data, and the equipment at a first position relative to the sensor,
      receive, from the AV, the first data captured by the sensor, the first data describing a current state of the equipment,
      instruct an actuator to re-position at least a portion of the equipment to a second position relative to the sensor of the AV,
      transmit a second instruction to the AV to capture second data describing the equipment, and
      receive, from the AV, the second data captured by the sensor, the second data further describing a current state of the equipment; and
   a processor to:
      compare the first data and second data describing the current state of the equipment to a model of the equipment, the model describing an expected state of the equipment,
      determine, based on the comparison, that the equipment differs from the expected state, and
      schedule maintenance for the equipment in response to the determination that the equipment differs from the expected state.

10. The equipment management system of claim 9, wherein the AV is located at a first AV position relative to the equipment, the AV comprises an onboard computer to instruct the AV to maneuver from the first AV position to a second AV position relative to the equipment, and the processor is further configured to compare third data captured by the sensor of the AV at the second AV position relative to the equipment.

11. The equipment management system of claim 9, wherein the model of the equipment is trained using machine-learning to classify the equipment as being in the expected state or being in a damaged state that differs from the expected state, the model trained by a first training data set describing the equipment in the expected state and at least one second training data set describing the equipment in the damaged state.

12. The equipment management system of claim 9, wherein the processor is further configured to:
    determine a wear level of the equipment based on the first data describing a current state of the equipment; and
    determine a predicted remaining service duration for the equipment based on the wear level.

13. The equipment management system of claim 12, wherein the processor is configured to schedule maintenance for the equipment based on the predicted remaining service duration for the equipment.

14. The equipment management system of claim 9, wherein the equipment comprises a display screen, the first data comprises an image of the display screen, and the processor is further configured to identify an error in the equipment based on the image of the display screen.

15. A method for inspecting equipment comprising:
    instructing a sensor of an autonomous vehicle (AV) to capture first data describing equipment for servicing the AV, the sensor selected from a plurality of sensors based on at least one of a type of equipment and the sensor located at a first position relative to the equipment;
    receiving the first data captured by the sensor, the first data describing a current state of the equipment for servicing the AV;
    maneuvering the AV so that the sensor is located at a second position relative to the equipment;
    receiving second data captured by the sensor at the second position relative to the equipment, the second data further describing the current state of the equipment;
    comparing the first data and the second data to a model of the equipment, the model describing an expected state of the equipment;
    determining, based on the comparison, that the equipment differs from the expected state; and
    determining to perform maintenance on the equipment.

16. The method of claim 15, further comprising:
    scheduling maintenance for the equipment in response to the determination to perform maintenance on the equipment; and
    directing a second AV of a fleet of AVs to use alternate equipment for servicing the second AV prior to the scheduled maintenance.

17. The method of claim 15, further comprising:
    determining a wear level of the equipment based on the first data describing the current state of the equipment; and
    determining a predicted remaining service duration for the equipment based on the wear level.

18. The method of claim 17, further comprising scheduling maintenance for the equipment based on the predicted remaining service duration for the equipment.

19. The method of claim 15, wherein the equipment is a connector of an AV charging station, the connector to plug into the AV to charge the AV, and the model describes an expected state of the connector.

20. The method of claim 15, wherein the sensor comprises a camera, the first data captured by the sensor comprises an image of at least a portion of the equipment, and the model is based on an expected image of the equipment.

* * * * *